United States Patent [19]
Crumly et al.

[11] Patent Number: 5,207,887
[45] Date of Patent: May 4, 1993

[54] SEMI-ADDITIVE CIRCUITRY WITH RAISED FEATURES USING FORMED MANDRELS

[75] Inventors: William R. Crumly, Anaheim; Christopher M. Schreiber, Newport Beach; David B. Swarbrick, El Toro, all of Calif.

[73] Assignee: Hughes Aircraft Company, Los Angeles, Calif.

[21] Appl. No.: 753,400

[22] Filed: Aug. 30, 1991

[51] Int. Cl.⁵ ............................................. C25D 1/20
[52] U.S. Cl. ..................................................... 205/78
[58] Field of Search .......................................... 205/78

[56] References Cited

U.S. PATENT DOCUMENTS 3,181,986  5/1965  Pritikin .............................. 156/233
4,125,441 11/1978  Dugan ................................. 204/12

Primary Examiner—T. M. Tufariello
Attorney, Agent, or Firm—Terje Gudmestad; Wanda K. Denson-Low

[57] ABSTRACT

A circuit is produced by using a formed mandrel (10,12) and semi-additive techniques for creating circuit traces. A stainless steel mandrel (10) flash plated with copper (14) includes a depression (12) which will form a raised interconnection feature (24). Using a photolithographically formed pattern of photoresistive material (16) on the mandrel the selected pattern of circuit traces (18,20) and raised features (24) are electroplated onto the flash plated mandrel. After stripping the photoresist (16), a dielectric substrate (26) is laminated to the circuit traces, effectively encapsulating the traces on three sides. After removing the laminated circuit traces and dielectric from the mandrel the flash plated copper (14) is removed and the circuit covered with an insulation coverlay.

17 Claims, 1 Drawing Sheet

SEMI-ADDITIVE CIRCUITRY WITH RAISED FEATURES USING FORMED MANDRELS

BACKGROUND OF THE INVENTION

1. Field of the Invention

The present invention relates to fabrication of electrical circuits, and more particularly concerns fabrication of circuits employing mandrels and semi-additive processes for making circuits having raised features.

2. Description of Related Art

In a prior application of William R. Crumly, Christopher M. Schreiber and Haim Feigenbaum for Three-Dimensional Electroformed Circuitry, Ser. No. 07/580,758, filed Sep. 11, 1990, assigned to the assignee of the present application, there are described techniques for fully additive forming of electrical circuits having integral raised features. The disclosure of this prior application is incorporated by this reference as though fully set forth herein. In general, the processes described in the prior application include the use of a stainless steel mandrel in which are formed raised features projecting from the mandrel surface, either downwardly into the mandrel or upstanding from the mandrel surface. A pattern of grooves in the form of a negative of a circuit to be fabricated is formed in the surface of the mandrel and filled with Teflon or other non-conductive material and the desired pattern of circuit traces is then electrodeposited onto the mandrel surface between the areas of Teflon and into the depressions or over the post of the three dimensional mandrel features. The use of Teflon embedded in groves within the mandrel to define the circuit traces limits the minimum size of circuit traces that can be formed, because, as the circuit trace is additively formed, as by electroplating, a plated material plates up laterally on either side at the same time that it plates up vertically above the surface. Accordingly, for example, to obtain a trace 1 mil thick and 4 mils wide, the conductive pattern line width on the mandrel can be no more than 2 mils in width, because the plating of a mil thickness also plates outwardly on either side to one 1 mil. Thus, fabrication of very fine circuit trace lines is limited.

If the Teflon pattern is deposited on the surface of the stainless steel mandrel instead of in grooves, finer circuit trace features and widths can be obtained, but difficulties are encountered in treating the mandrel surface to achieve satisfactory adherence of the Teflon to the stainless steel mandrel surface.

The fully additive techniques described in the above-identified patent application have many advantages. After the mandrel has been made there is no need to do any further printing or photo operations. All registration of the raised features with the circuit traces is completed, and there are no subsequent registration problems. Further, there are no further photolithographic operations, and much manual labor in the use of the completed mandrels for production of circuits is eliminated. Nevertheless the mandrel itself is relatively complex and expensive and time consuming to produce, and, therefore, finds maximum utility in relatively long production runs where rapid fabrication of the first prototype and production items is not essential. Thus, the fully additive mandrel for making circuits with raised features is most useful for long production runs where time of initial production is of lesser importance, but such mandrels are not as readily applicable for production of raised feature circuits in smaller quantities where the first prototype must be available in a short time.

Accordingly, it is an object of the present invention to provide for production of electrical circuits with raised features by methods that avoid or minimize above mentioned problems.

SUMMARY OF THE INVENTION

In carrying out principles of the present invention in accordance with a preferred embodiment thereof a simple, more readily formed mandrel is employed and semi-additive rather than fully additive techniques are used with the mandrel for making the circuit with its raised features. The electrically conductive mandrel is provided with a pattern of dimples or depressions and is then coated with a very thin coat of electrically conductive material. Thereafter a pattern of resist is formed on the coating, and the circuit traces are electroformed on the mandrel, while, at the same time, forming the raised features in the mandrel depressions. After removal of the resist, a dielectric and adhesive layer is bonded to the electroformed circuitry and raised features, after which the lamination of dielectric and circuitry with raised features may be removed from the mandrel, ready for removal of the coating and application of coverlay laminations.

DETAILED DESCRIPTION OF THE PREFERRED EMBODIMENT

According to principles of the present invention, an improved mandrel is used which can be fabricated rapidly and requires no permanently affixed Teflon or other non-conductive pattern. Thus the mandrel is simpler and faster to make and is also more durable.

Figure 1:
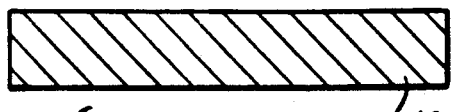
FIGS. 1 through 9 illustrate several steps in the manufacture of multi-layer circuitry embodying the principles of the present invention.
Figure 2:

As illustrated in FIG. 1, a stainless steel plate 10 forms a mandrel having a forming surface 11 in which is provided one or a plurality of depressions or dimples 12, as shown in FIG. 2, which will define raised features of the resulting circuitry.

Figure 3:
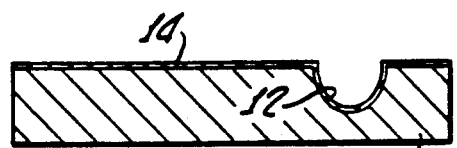

As shown in FIG. 3, the mandrel and its depression or depressions is then coated with a copper coating 14, typically referred to as flash plated, which covers the entire surface of the mandrel, including the surface of the depressions. The flash plated copper is applied by electroplating or other known techniques and provides a thin conductive coating that prevents the adhesive (that will be used to laminate the circuit substrate) from adhering to the mandrel surface. Flash plating is a conventional electrolytic plating formed in a very short or momentary operation so that only a very thin plating coat is provided. The flash plated coat is very thin compared to the thickness of the electrical circuit traces that are made. For example, for a circuit trace of 1 ½ mil thickness, a flash plating of copper on the mandrel will have a thickness of 0.01 to 0.2 mils. The thin flash plating is employed because it can be relatively easily released from the stainless steel mandrel, and, in addition, may be readily removed from the lamination after separation from the mandrel by a flash etching, which is a very short time or momentary etching process. Obviously, other methods for coating the mandrel with a very thin coat of conductive material that is readily separable from the mandrel and which can be readily removed from the completed circuit traces may be employed in the place of the electrolytic flash plating. Such methods may include sputtering, vapor deposition and electroless plating. If deemed necessary or desirable, the mandrel may be made of a non-electrically conductive material because the thin electrically conductive coating itself enables the additive electroplating of the circuit traces and raised features. The coating, for a dielectric mandrel, can be applied by electroless plating, sputtering, or additional conductive particles in solution. No pattern of non-conductive material, such as Teflon, is permanently affixed to the mandrel. Instead, the flash plated copper is coated with a photoresist, which is then optically exposed through a mask defining a pattern of the desired circuit and developed. The photoresist that has not been polymerized is then removed to leave the partially completed assembly in the configuration illustrated in FIG. 4. As shown, the flash plated copper coating 14 now bears a pattern 16 of photoresist that is a negative pattern of the circuit trace pattern to be fabricated with this mandrel.

Figure 4:
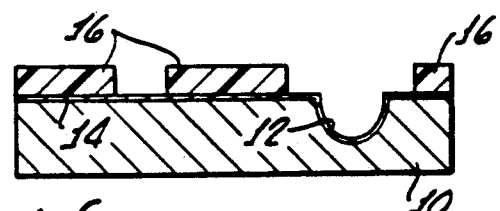
Figure 5:
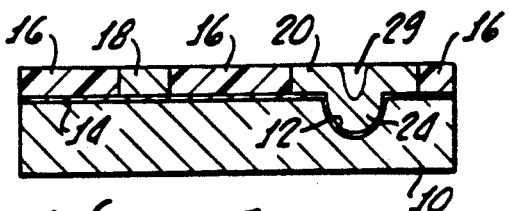

The mandrel assembly of FIG. 4 is then subjected to a suitable additive electroforming process, such as, for example, electroplating, to plate up copper traces, including trace 18 and a raised feature pad 20, including a raised feature 24 in the depression 12, as shown in FIG. 5. The copper traces are plated directly onto those portions of the flash plated copper coating 14 that are not covered by the negative pattern of developed photoresist 16. Thus the plating process simultaneously forms both the circuit traces and the raised features. The raised features 24 are partly hollow, having a depression 29 (FIG. 5). If deemed necessary or desirable, the depression 29 formed in the electroplated raised feature 24 may be filled with a solid material 30 (FIG. 6) by placing a dollop of epoxy in the depression and then allowing the epoxy to cure.

Figure 6:
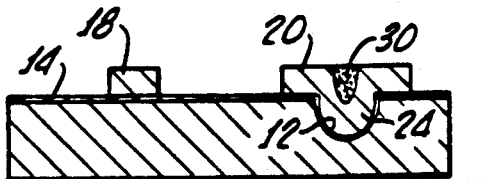

The photoresist 16 is then stripped to leave the circuit traces and raised features 18,20, and 24 on the flash plated copper coating which is still on the mandrel, as shown in FIG. 6. Now a layer of a suitable dielectric and adhesive, such as, for example, a layer 26 of Kapton and an adhesive, are laminated to the mandrel assembly with the traces and circuit features thereon under suitable high temperatures and pressures. This causes the Kapton and adhesive to flow into the spaces between the traces and thereby contact traces and pads on three sides. Only that side of the traces and pads that is directly in contact with the flash plated copper on the mandrel is not contacted by the adhesive/Kapton substrate 26.

Figure 7:
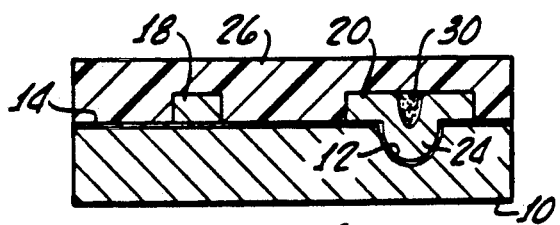

The assembly now appears as in FIG. 7, including the mandrel 10, the flash plated copper 14, traces, pads and features 18,20 and 24, and the Kapton/adhesive substrate 26.

The circuit assembly of FIG. 7 is then removed from the mandrel. Because only the flash plated copper contacts the mandrel, this may be readily separated, and no adhesive of the substrate 26 is in contact with the mandrel. Thus it will be seen that because the mandrel has been initially coated with the protective layer of the flash plated copper 14, the assembly of dielectric/adhesive substrate and circuit traces and raised features can be readily separated from the mandrel, together with the flash plated copper coating. This separated sub-assembly is shown removed from the mandrel in FIG. 8.

Figure 8:
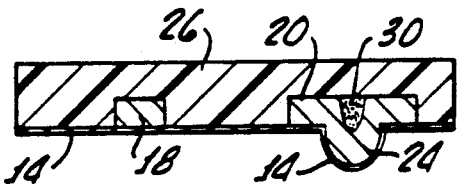
Figure 9:
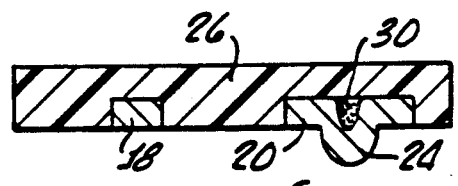

Then, as indicated in FIG. 9, the flash plated copper coating, which covers the entire lower (as viewed in FIG. 8) surface of the assembly of FIG. 8, is removed by a flash etching process to yield the finished or substantially finished sub-assembly of FIG. 9. The sub-assembly of FIG. 9 is ready for the coverlay lamination, which comprises the standard process for covering at least the side of the sub-assembly bearing the conductive traces with an insulative coverlay.

If deemed necessary or desirable, the removal of the flash plated copper coating may be controlled by a "stop" layer of gold, which will protect the thicker copper circuit during flash etch removal of the flash plated copper. To this end, the flash coated mandrel with its photolithographically defined resist pattern 16 in place, as shown in FIG. 4, may be plated with a thin layer of gold, about 0.00006 inches thick, upon which the circuitry 18 and 20 will be plated. This patterned gold "stop" layer allows the flash plated copper to be removed by the flash etching from the dielectric, but protects the copper circuit.

The above described semi-additive processes for making circuitry with raised features have many advantages over the fully additive processes described in the above identified co-pending application. The manufacture of the flash plated mandrel is much simpler, cheaper and considerably faster, as no elaborate processes need be undertaken to place a permanent coating of Teflon or other non-conductive material thereon. Accordingly, such mandrels may readily be made in different configurations for manufacture of circuit traces of different patterns. The simplified fabrication of the mandrel results in faster availability of the mandrel for manufacture of the circuitry so that a mandrel made for use in the semi-additive processes described herein may be made one day and will be available for making parts the next day, whereas parts may not be available nearly as soon from a mandrel made according to the fully additive techniques described in the above application. Further, because of the simplicity and lower cost of making the flash plated mandrel, it is considerably cheaper and is economically feasible for use in smaller production runs.

It will be seen that the method of circuit fabrication described herein incorporates a more rugged, considerably simpler mandrel for electroplating, and still employs primarily additive techniques, such as electroplating, for creating circuit patterns and integral raised features.

What is claimed is:

1. A method of making a multi-layer circuit having raised features comprising the steps of:

forming a mandrel having at least one depression therein, coating said mandrel and depression with an electrically conductive material such that said coating is readily separable from said mandrel and said depression, additively forming a pattern of circuit traces on said coating and in said depression, laminating a dielectric substrate to said traces and depression, wherein said coating effectively blocks said dielectric substrate from adhering to said mandrel, removing said traces, said substrate and said coating from said mandrel, said step of additively forming comprising forming a raised feature that projects from the plane of said circuit traces, and removing said coating from said traces, said raised feature and said substrate after the step of removing from said mandrel.

2. The method of claim 1 wherein said step of additively forming a pattern of circuit traces comprises the steps of applying a pattern of resist to said coating, and electroforming conductive material on said mandrel and coating between elements of said resist pattern.

3. The method of claim 2 wherein said step of coating said mandrel comprises flash plating, wherein said step of additively forming comprises electroplating, and wherein said coating is readily removably from said traces, said raised feature and said substrate such that said step of removing said coating comprises flash-etching.

4. The method of claim 3 including the step of applying a stop coat to said coating prior to forming said pattern of circuit traces for protection of said circuit traces during said step of removing said coating.

5. A mandrel for reproducibly forming a raised feature multi-layer circuit by electrodeposition comprising:
a body having a forming surface,
a depression in said surface configured and arranged to form a raised feature of a circuit to be formed on the mandrel, and
an electrically conductive coating on said forming surface and depression, said coating being readily separable from said surface such that said mandrel is reusable for forming others of said raised feature mult-layer circuit.

6. The mandrel of claim 5 including a pattern of non-conductive material formed on said coating.

7. The mandrel of claim 5 including a pattern of photoresist on said coating, said photoresist having a pattern that is a negative of a pattern of circuit traces, whereby a pattern of circuit traces having a portion extending into said depression may be electrodeposited on said coating and laminated to a non-conductive substrate by means of an adhesive which does not contact said forming surface.

8. A method for making a multi-layer electric circuit having raised features comprising the steps of:
forming a mandrel having a forming surface and a raised mandrel feature,
applying to said surface and feature an electrically conductive coating having a thickness which is thin enough to be readily separable from said surface and said feature;
additively forming a pattern of circuit traces on said coating,
additively depositing a conductive material raised feature on said mandrel feature,
adhesively securing a substrate to said circuit traces and conductive material raised feature, wherein said coating thickness is thick enough to effectively block said substrate from adhering to said surface of said mandrel,
removing said substrate, circuit traces, conductive material raised feature and coating from said mandrel such that said mandrel is readily reusable, and
removing said coating from said traces, conductive mandrel raised feature and substrate.

9. The method of claim 8 wherein said mandrel includes a depression shaped to form said conductive material raised feature, wherein said step of applying a coating comprises applying the coating to said depression, and wherein said step of forming a pattern of circuit traces comprises forming a part of said traces in said depression.

10. The method of claim 8 wherein said step of forming a pattern of traces comprises electrodepositing a pattern of conductive material on said coating.

11. The method of claim 8 wherein said step of forming a pattern of traces comprises photolithographically forming a negative pattern of resist on said coating, and electroplating said traces on said coating.

12. The method of claim 11 including the steps of removing said resist and laminating a layer of insulative material and adhesive to said electroplated traces.

13. The method of claim 12 including the step of removing said insulative material, adhesive, traces and conductive coating from said mandrel.

14. The method of claim 13 including the step of removing said conductive coating from said traces and layer of insulative material and adhesive.

15. The method of claim 8 wherein said step of applying a conductive coating comprises flash plating copper on said mandrel conductive surface.

16. The method of claim 8 wherein said step of applying a conductive coating comprises flash plating copper on said mandrel surface and including the step of removing said copper by flash etching.

17. The method of claim 16 including the step of applying a stop coating to said flash plating copper over the pattern of said traces, said stop coating being formed of a material resistant to said flash etching.

* * * * *